United States Patent [19]

Leupold

[11] Patent Number: 4,862,128

[45] Date of Patent: Aug. 29, 1989

[54] FIELD ADJUSTABLE TRANSVERSE FLUX SOURCES

[75] Inventor: Herbert A. Leupold, Eatontown, N.J.

[73] Assignee: The United States of America as represented by the Secretary of the Army, Washington, D.C.

[21] Appl. No.: 345,045

[22] Filed: Apr. 27, 1989

[51] Int. Cl.$^4$ .................................. 335 306; 335 212; 335 210; 315 5.26; 315 5.28; 315 5.34; 315 5.35

[52] U.S. Cl. .................................. 335/306; 335/212; 315/5.35; H01F/7/02

[56] References Cited

U.S. PATENT DOCUMENTS

| | | | |
|---|---|---|---|
| 4,538,130 | 8/1985 | Gluckstern et al. | 335/306 |
| 4,758,813 | 7/1988 | Holsinger et al. | 335/306 |
| 4,764,743 | 8/1988 | Leupold et al. | 335/306 |

Primary Examiner—George Harris
Attorney, Agent, or Firm—Michael J. Zelenka; John K. Mullarney

[57] ABSTRACT

A permanent magnet structure comprising multiple hollow substantially cylindrical flux sources embedded one within another about an axially extending center passage such that each flux source is free to rotate in either direction by any desired angular magnitude independent of the motion of the other(s). In the case of a plurality of axially aligned truncated HCFS structures, the array may be arranged to provide a periodic magnetic struture suitable for use in a wiggler, or with a helical locus suitable for use in a twister.

15 Claims, 5 Drawing Sheets

H=+Hmax

H=-Hmax

H=0

FIELD ADJUSTABLE TRANSVERSE FLUX SOURCES

The invention described herein may be manufactured, used, and licensed by or for the Government for governmental purposes without the payment to me of any royalties thereon.

TECHNICAL FIELD

The present invention relates in general to permanent magnet structures for use in electronic devices and, more particularly, to magnet structures which are required to produce intense, uniform magnetic fields in confined spaces, e.g. NMR imaging devices, traveling wave tubes, and other electron (magnetic) biasing devices.

BACKGROUND OF THE INVENTION

Many devices that employ magnetic fields have heretofore been encumbered by massive solenoids with their equally bulky power supplies. Thus, there has been increasing interest in the application of permanent magnet structures for such uses as electron-beam focusing and biasing fields. The current demand for compact, strong, static magnetic field sources that require no electric power supplies has created needs for permanent magnet structures of unusual form. A number of configurations have been designed and developed for electron beam guidance in millimeter wave and microwave tubes of various types; for dc biasing fields in millimeter wave filters, circulators, isolators, striplines; for field sources in NMR (nuclear magnetic resonance) imagers; and so on. Especially promising for such purposes is the configuration based upon the hollow cylindrical flux source (HCFS) principle described by K. Halbach in "Proceedings of the Eighth International Workshop on Rare Earth Cobalt Permanent Magnets", Univ. of Dayton, Dayton, Ohio, 1985 (pp. 123–136). A HCFS, sometimes called a "magic ring", is a cylindrical permanent magnet shell which produces an internal magnetic field that is more or less constant in magnitude. The field is perpendicular to the axis of the cylinder, and furthermore the field strength can be greater than the remanence of the magnetic material from which the ring is made.

The ideal hollow cylindrical flux source (HCFS) is an infinitely long, annular cylindrical shell which produces an intense magnetic field in its interior working space. The direction of the magnetic field in the working space interior is perpendicular to the long axis of the cylinder. The aforementioned Halbach publication discloses a structure with an octagonal cross section which closely approximates the performance and field configuration of an ideal HCFS (which has a circular cross section). In both the ideal and Halbach configurations, no magnetic flux extends to the exterior of the ring structure (except at the ends of a finite cylinder).

The terms HCFS and "magic ring" as used herein encompasses not only the ideal cylindrical structure but also octagonal, sixteen sided, thirty-two sided and even higher order polygonal-sided structures which approximate the ideal HCFS structure.

Unfortunately, the HCFS as heretofore constructed produced a field which was more-or-less constant for the given structure. Often, however, applications require the magnetic field to be adjusted through a range of values. It is desirable to create fields that can be readily adjusted by mechanical means, with continuous variation from zero or some minimum to the maximum field strength.

SUMMARY OF THE INVENTION

It is therefore a primary object of this invention to provide a permanent magnet structure wherein the interior magnetic flux can be varied continuously from zero to the maximum field for the given configuration.

It is another primary object of the invention to allow the orientation of the field to be directed along any angular direction desired.

The above and other objects are achieved in accordance with the present invention, which makes advantageous use of a plurality of HCFS structures uniquely combined to create an adjustable version of an embedded HCFS configuration.

The present invention comprises a plurality of hollow substantially cylindrical flux sources (HCFS) embedded one within another such that the HCFS structures are axially aligned and the outer radius of the inner HCFS structure substantially equals the inner radius of the next structure. The present invention is so constructed that each HCFS structure can be rotated either clockwise or counterclockwise by any desired angle. Each ring can be rotated independantly of the motion of any other ring.

The HCFS structures are characterized by their ability to add magnetic fields geometrically. Therefore, the resultant field in the central cavity is the vector sum of the fields independently generated by the constituent structures.

In the preferred embodiment of the present invention, two HCFS structures are so embedded and axially aligned. It is constructed such that the HCFS structures independently generate fields of equal magnitude. The two HCFS structures can be oriented such that the independently generated internal field of each structure is directed along the same axis. At this position a maximum field is achieved in the central cavity. Each of the two HCFS structures may be rotated in opposite directions but with equal angular displacement. The result is a central cavity field whose direction is still along the original axis but whose magnitude has changed. By rotating inner and outer HCFS structures by equal but opposite angular displacements, the resultant cavity field can be made to vary from a positive maximum value through a continuous range of values to zero and then from zero to a negative maximum value (i.e., a reversal in direction). If the direction of the cavity field is desired to be at any angle other than the original axis, the entire assembly may be rotated to the desired direction. In this manner, both magnitude and direction of the field can be continuously adjusted.

It is an advantageous feature of the present invention that a plurality of embedded HCFS structures can be truncated and then oriented, relative to each other, so that a "wiggler" function is provided; alternatively, the embedded HCFS structures can be oriented to achieve a "twister" function.

BRIEF DESCRIPTION OF THE DRAWINGS

The invention will be more fully appreciated from the following detailed description when the same is considered in connection with, the accompanying drawings in which.

DETAILED DESCRIPTION OF THE DRAWINGS

Figure 1:
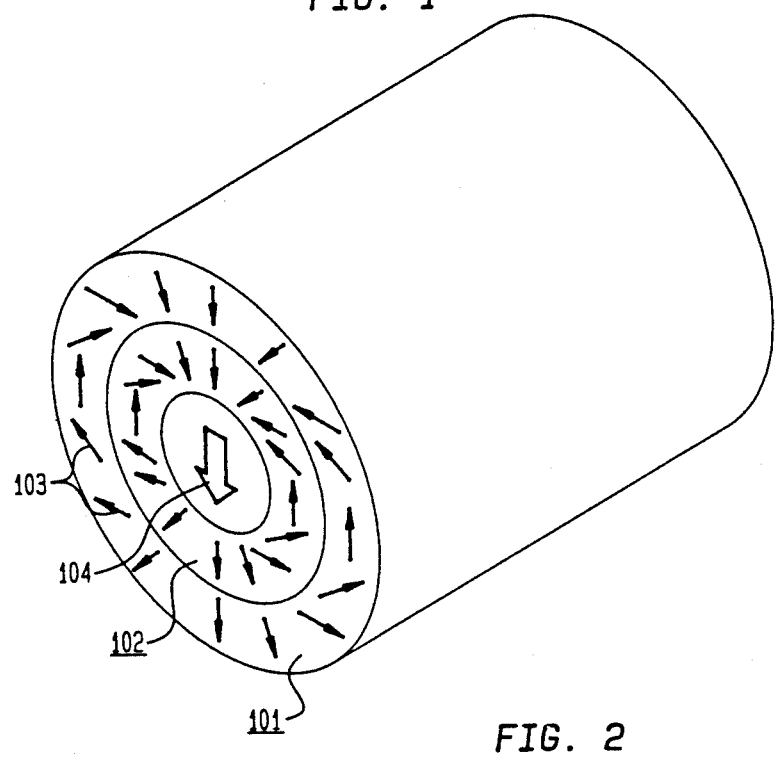
FIG. 1 is a perspective schematic diagram of embedded, axially aligned hollow cylindrical flux source structures each free to rotate independently about the central axis according to the present invention.

FIG. 1 shows an embodiment of the present invention which comprises two hollow substantially cylindrical flux sources, 101 and 102, one embedded within the other such that they are axially aligned and the outer radius of one equals the inner radius of the next structure. Arrows 103 illustrate the magnetic orientation of the field interior to the rings. The resultant field in the working space of the central cavity is represented by arrow 104.

The magnetic field strength $\vec{H}_w$ independently produced by each HCFS structure is assumed to be known. Design procedures known to those skilled in the art permit one to calculate the magnetic field strength within the central cavity of an HCFS structure when the inner and outer radii of the ring are known, together with the remanence, $\vec{B}_r$, of the magnetic material comprising the ring. For example, for an ideal, infinitely long HCFS, the magnetic field strength is given by $\vec{H}_w = \vec{B}_r \ln (r_2/r_1)$ where $r_2$ = outer radius of the HCFS
$r_1$ = inner radius of the HCFS
$B_r$ = remanence of HCFS material In accordance with the present invention, the magnetic field strengths $\vec{H}_{w1}$ and $\vec{H}_{w2}$ add geometrically. That is, $\vec{H}_w = \vec{H}_{w1} = \vec{H}_{w2}$.

In the preferred embodiment of the present invention, the magnitudes of the field strengths of each ring are made equal, that is $\vec{H}_{w1} = \vec{H}_{w2}$. When this is the case, then the relationship between the radius (r) defining the boundary between said pair of HCFS structures is given by $r = \sqrt{R_o R_i}$ where $R_o$ = outer radius of outer flux source
$R_i$ = inner radius of the inner flux source Each of these HCFS structures are free to rotate about the central axis independent of the motion of the other. The rotations may be of any angular magnitude and may be either positive or negative rotations. These independent motions form the basis for variation of the field magnitude and direction in the central cavity of the device.

It may be advantageous to add a third thinner outermost HCFS structure to this assembly that can be used to produce small adjustments in the field magnitude and/or direction. However, this embodiment has been described by way of illustration and not limitation and need not be so limited. Accordingly, greater or fewer rings may be stacked in the embedded structure.

The terms HCFS and "magic ring" encompasses not only the ideal cylindrical structure in which mathematically the azimuthal field dependence is assumed continuous but also segmented approximations in which each segment has the magnetization constant in both amplitude and direction within any one segment. The invention is not limited to any specific number of segments and the greater the number of segments the closer the approximation to the ideal case. The HCFS structure as used herein encompasses not only the ideal cylindrical structure but also octagonal, sixteen sided, thirty-two sided and even higher order polygonal sided structures which approximate the ideal HCFS structure. The present invention with all its embodiments can be constructed with these approximate structures. In these cases, the active shells of the structure would be embedded in cylindrical rings of non-magnetic material in order to provide the proper bearing surfaces for rotation. Of course, this procedure is less space efficient that that for circular structures. Although circular and polygonal sided HCFS structures are described, as will be evident to those skilled in the art, the principle does not depend on HCFS structures for its application. Any magnetic circuit that is free of iron or other soft magnetic material can be used.

Figure 2:
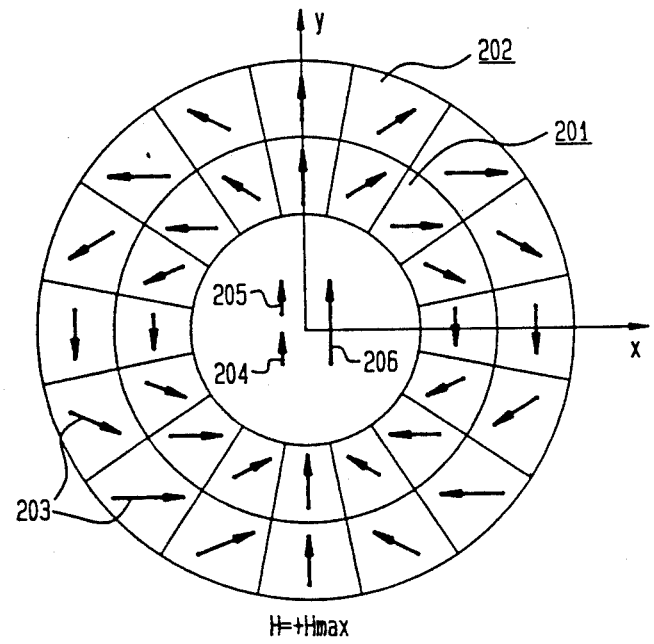
FIGS. 2, 3, 4, and 5 are cross-sectional schematic diagrams of hollow cylindrical flux sources, embedded and free to rotate in accordance with the present invention, illustrating the magnetic field orientations in the segments and in the central cavity at selected positions of angular rotation.

FIG. 2 illustrates a pair of segmented HCFS structures, 201 and 202, embedded one within the other and free to rotate independently in either direction. Arrows 203 designate the magnetization directions within each segment.

For the purposes of discussion, the relative orientation of the respective fields, 204 and 205, of the HCFS as diagrammed in FIG. 2 shall be termed the "initial position". In this position, the cavity fields, 204 and 205, are both aligned along the y-axis. The fields add vectorially to produce a maximum magnitude, that is, $H = +H_{Max}$. The resultant field is labelled 206.

Figure 3:
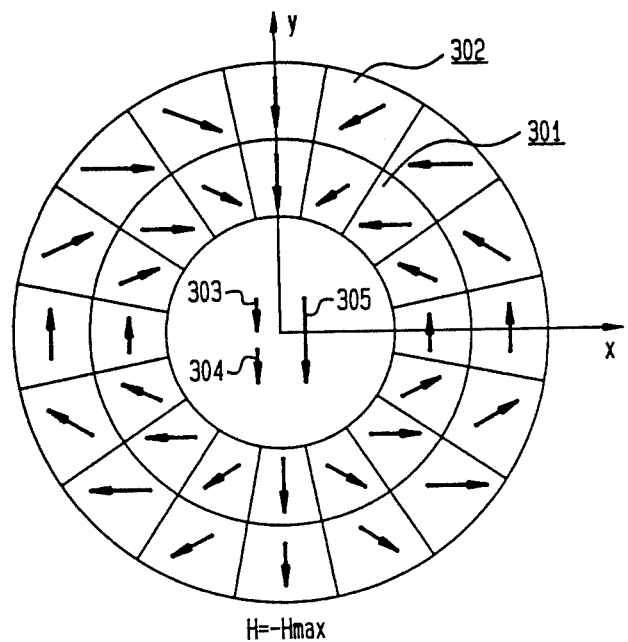

FIG. 3 illustrates another relative orientation of field vector components, 303 and 304. In this position HCFS structure 301 has been rotated by 180° in an angular displacement arbitrarily defined to be in the positive $\theta$ (theta) direction. HCFS structure 302 has also been rotated by 180° but in a minus $\theta$ (theta) direction. The result is two field component vectors of equal magnitude both of which are directed along the axis in a direction opposite to that of the "initial position". The resultant field, 305, $H_w$ in the central cavity, is at maximum magnitude but oriented in the minus direction, that is, $H = -H_{Max}$.

Figure 4:
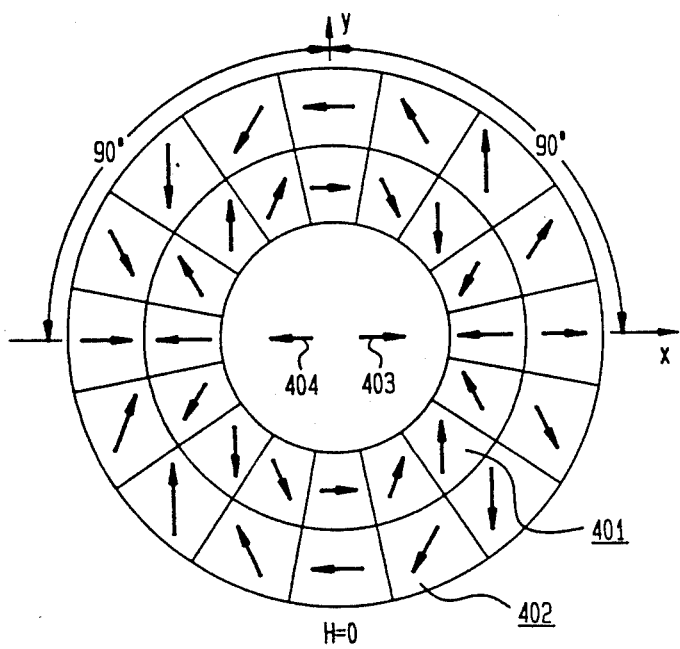

FIG. 4 represents yet another relative position. In this case, HCFS structure 401 has been rotated from the initial position by a 90° rotation in an arbitrarily designated positive $\theta$ (theta) direction, while structure 402 has been accordingly rotated by −90°. Equal field components, 403 and 404, now lie in opposite directions along the x-axis. The resultant field $H_w$ is now zero.

Figure 5:
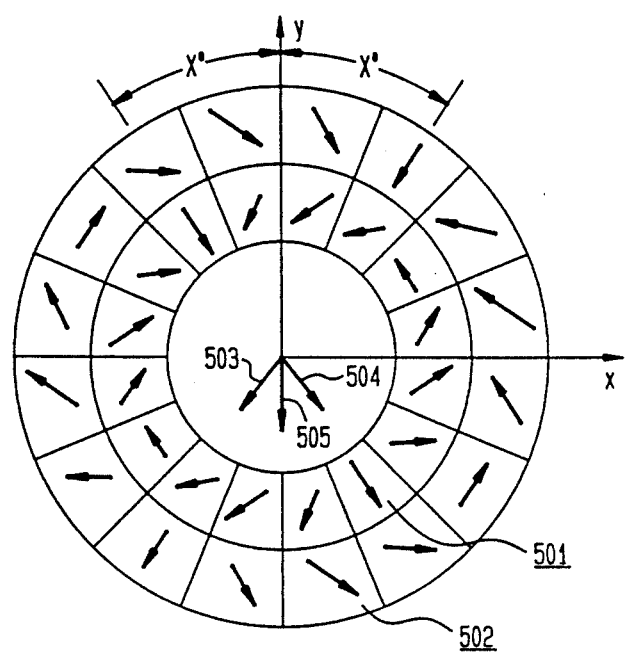

FIG. 5 generalizes the effect of the relative motion of the embedded HCFS structures on resultant field magnetization to illustrate the basic operation of the present invention. Ring 501 is rotated from the initial position by angle x°, arbitrarily designated in the positive direction. Ring 502 is rotated by angle x° but in the opposite direction. Component field vectors, 503 and 504, are shown. The resultant field, 505, of the cavity is given by the vector sum of the components FIGS. 2 through 5 provide examples of a novel and unique field adjustment mechanism. Rotation of the HCFS structures by equal and opposite angular displacements produces resultant fields which can have any value from zero to a maximum value for the device and may be oriented in either a positive or negative direction along the axis which defines the initial position If it is desirable to orient the resultant field in any direction other than along the initial y axis, the entire assembly may be rotated to the desired angle. In this manner, the field is adjustable to any magnitude from zero to a maximum for the device and may be oriented at any angle.

Figure 6:
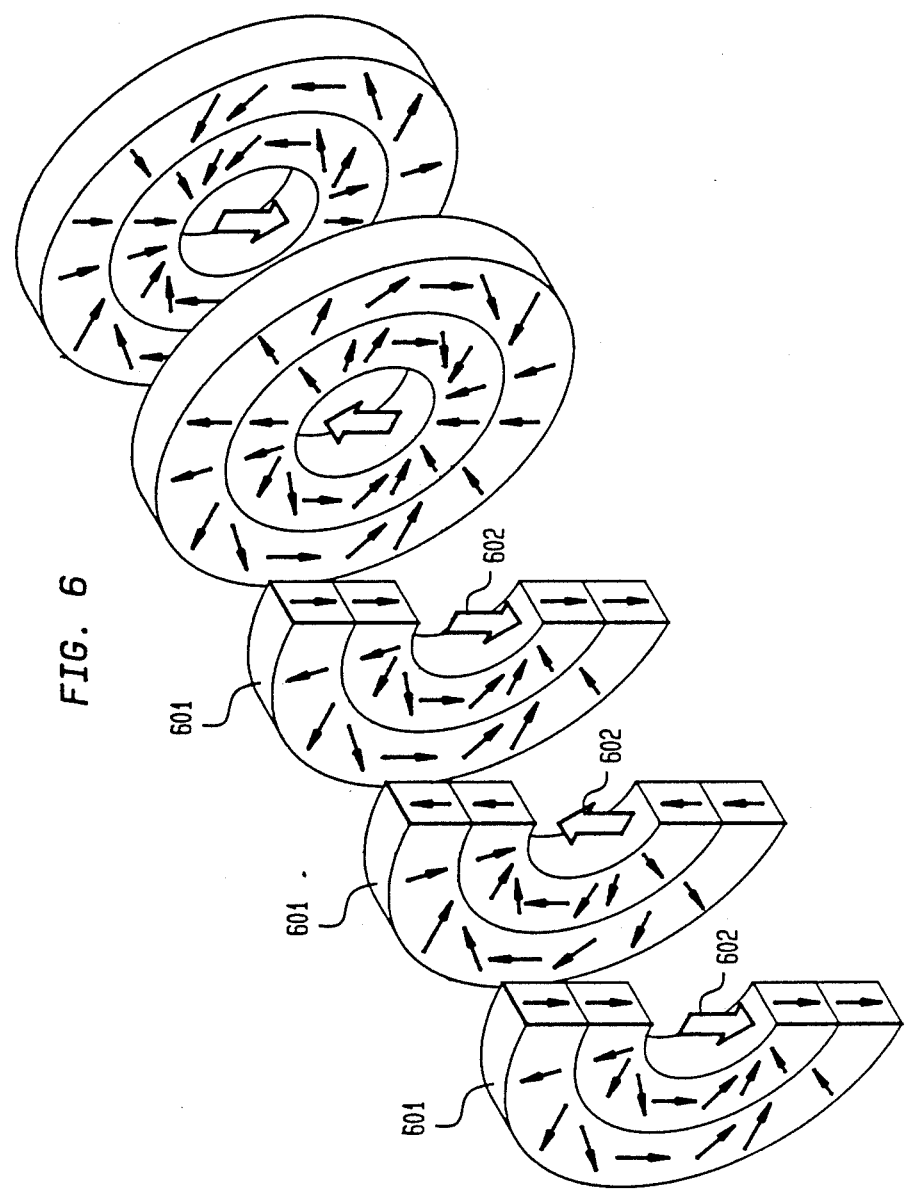
FIG. 6 is an exploded schematic diagram of a plurality of truncated hollow cylindrical flux sources embedded and free to rotate in accordance with the present invention arranged in an array so that the interior magnetic fields continually alternate in direction, that is, the successive fields are 180° apart.

FIG. 6 represents another embodiment of the present invention in which a plurality of truncated HCFS structures, 601, constructed in accordance with the present invention, are arranged in an axially aligned linear array so that their interior working space resultant magnetic fields, 602, are 180° apart. That is, the interior magnetic fields of successive embedded HCFS structures in the array alternate in direction in an up-down-up-down pattern. Therefore, the array has a continuous central cavity composed of alternating up-down-up-down magnetization through which an electron beam may be passed. This embodiment as described functions as a wiggler; a wiggler is a high power (megawatt) radiation source. In wiggler operation, an electron beam is injected into a drift region which is surrounded by a periodic magnet source. The periodic magnet source creates a magnetic field which changes in direction (by 180°) at fixed intervals, yet is always perpendicular to the principal direction of electron beam travel.

Figure 7:
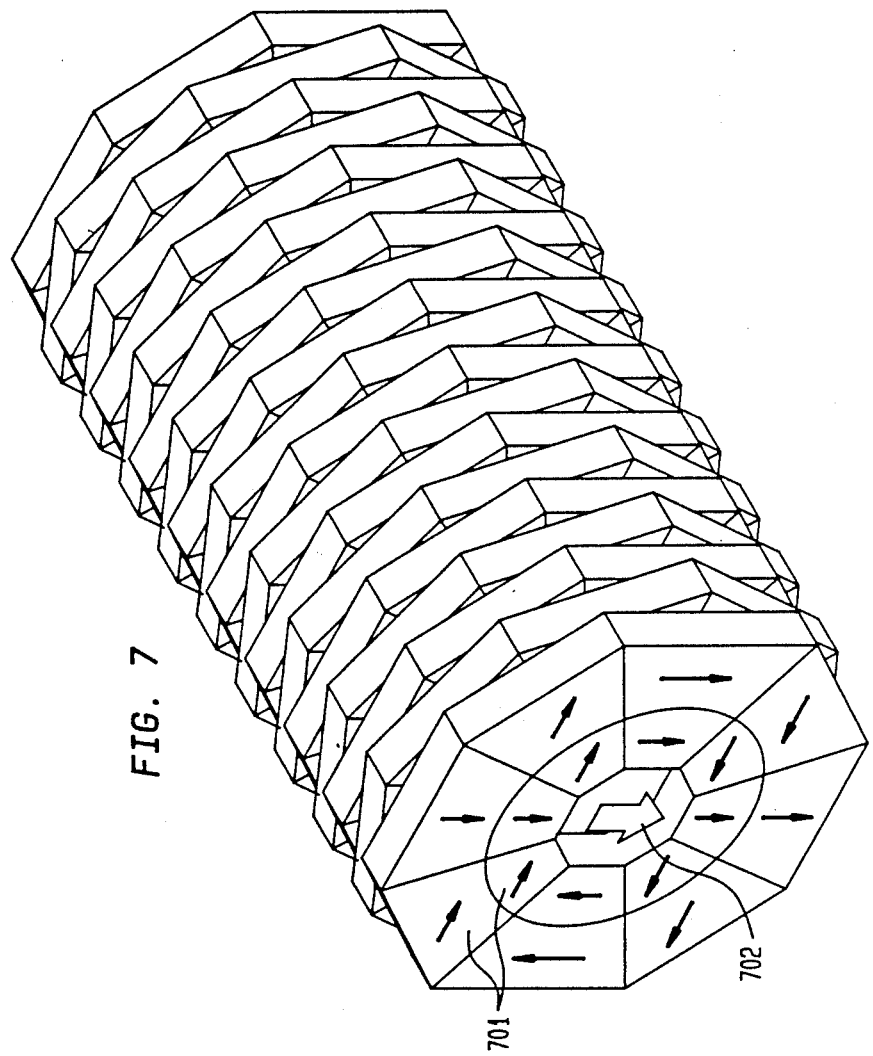
FIG. 7 is a perspective schematic diagram of a plurality of truncated hollow cylindrical flux sources embedded and free to rotate in accordance with the present invention arranged in an array so that the interior magnetic fields form a helical locus.

FIG. 7 represents another embodiment in which a plurality of truncated HCFS structure pairs, 701, each pair embedded and free to rotate independently in accordance with the present invention, are arranged in an axially aligned linear array so that their interior working space magnetic fields, 702, form a helical locus. This is achieved by serially rotating each embedded HCFS pair so that each segment differs from that of its predecessor by a fixed angle. This will displace its magnetization along a helical locus, thus giving the entire array the capacity to define a twisted or helically oriented magnetic field through the axially extending center passage. An electron beam can be passed through the central cavity. Such a device is termed a twister. For a more detailed description of a twister, reference can be had to my co-pending application, Ser. No. 316,374, filed Feb. 24, 1989.

Accordingly, having shown and described what is at present considered to be several preferred embodiments of the invention, it should be understood that the same has been shown by way of illustration and not limitation. And all modifications, alterations, and changes coming within the spirit and scope of the invention are hereby meant to be included.

What is claimed is:

1. A magnetic structure comprising a plurality of hollow substantially cylindrical flux sources embedded one within another about an axially extending central cavity, the outer radius of one flux source being substantially equal to the inner radius of the next surrounding flux source, each flux source being free to independently rotate about the axis in either direction and by any angular amount, said plurality of flux sources serving to produce a uniform high field in said central cavity.

2. A magnetic structure as defined in claim 1 wherein said plurality comprises a pair of hollow substantially cylindrical flux sources.

3. A magnetic structure as defined in claim 2 wherein each of the pair of hollow substantially cylindrical flux sources independently produces a magnetic field in the central cavity equal to that of the other.

4. A magnetic structure as defined in claim 2 wherein the radius (r) defining the boundary between said pair is given by $r = \sqrt{R_o R_I}$, where $R_o$ = outer radius of the outer flux source and $R_I$ = inner radius of the inner flux source.

5. A magnetic structure comprising an array of multiple truncated hollow substantially cylindrical flux sources embedded one within another about an axially extending central cavity, the outer radius of one flux source being substantially equal to the inner radius of the next surrounding flux source, each flux source being free to independently rotate about the axis in either direction and by any desired angular amount, the truncated embedded flux sources being axially aligned in a linear array and each producing a uniform high field in the central cavity.

6. A magnetic structure as defined in claim 5 wherein the magnetic fields in the central cavity of said array alternate in direction along the axis of the array.

7. A magnetic structure as defined in claim 6 wherein the direction of the magnetic fields in the central cavity are perpendicular to the axis of the array.

8. A magnetic structure as defined in claim 7 wherein said embedded flux sources comprise a pair of hollow substantially cylindrical flux sources.

9. A magnetic structure as defined in claim 8 wherein each of the pair of hollow substantially cylindrical flux sources independently produces a magnetic field in the central cavity equal to that of the other.

10. A magnetic structure as defining in claim 9 wherein the radius (r) defining the boundary between said pair is given by $r = \sqrt{R_o R_I}$, where $R_o$ = outer radius of the outer flux source and $R_I$ = inner radius of the inner flux source.

11. A magnetic structure as defined in claim 5 wherein the magnetic fields in the central cavity in said array define a helical locus.

12. A magnetic structure as defined in claim 11 wherein the direction of the magnetic fields in the central cavity are perpendicular to the axis of the array.

13. A magnetic structure as defined in claim 12 wherein said embedded flux sources comprise a pair of hollow substantially cylindrical flux sources.

14. A magnetic structure as defined in claim 13 wherein each of the pair of hollow substantially cylindrical flux sources independently produces a magnetic field in the central cavity equal to that of the other.

15. A magnetic structure as defined in claim 14 wherein the radius (r) defining the boundary between said pair is given by $r = \sqrt{R_o R_I}$, where $R_o$ = outer radius of the outer flux source and $R_I$ = inner radius of the inner flux source.

* * * * *